US 8,497,690 B2

(12) United States Patent
Bartling et al.

(10) Patent No.: US 8,497,690 B2
(45) Date of Patent: Jul. 30, 2013

(54) AUTOMATED CAPACITIVE TOUCH SCAN

(75) Inventors: James E. Bartling, Phoenix, AZ (US);
Jason Tollefson, Phoenix, AZ (US);
Bruce Bohn, Chandler, AZ (US)

(73) Assignee: Microchip Technology Incorporated,
Chandler, AZ (US)

( * ) Notice: Subject to any disclaimer, the term of this patent is extended or adjusted under 35 U.S.C. 154(b) by 930 days.

(21) Appl. No.: 12/555,956

(22) Filed: Sep. 9, 2009

(65) Prior Publication Data

US 2010/0102832 A1    Apr. 29, 2010

Related U.S. Application Data

(60) Provisional application No. 61/108,660, filed on Oct. 27, 2008.

(51) Int. Cl.
*G01R 27/26* (2006.01)
(52) U.S. Cl.
USPC ........... 324/678; 324/661; 324/662; 324/686; 178/18.06; 178/19.03
(58) Field of Classification Search
USPC .................. 324/661, 662, 678, 686; 345/173, 345/174; 178/18.06, 19.03; 713/300–340
See application file for complete search history.

(56) References Cited

U.S. PATENT DOCUMENTS

| | | | | |
|---|---|---|---|---|
| 5,585,733 A | * | 12/1996 | Paglione | 324/678 |
| 6,075,520 A | * | 6/2000 | Inoue et al. | 345/173 |
| 6,275,047 B1 | | 8/2001 | Zoellick et al. | 324/678 |
| 6,617,994 B1 | * | 9/2003 | Heim et al. | 341/172 |
| 7,973,534 B2 | * | 7/2011 | Tatebayashi et al. | 324/433 |
| 8,154,310 B1 | * | 4/2012 | Maharyta et al. | 324/686 |
| 2002/0140438 A1 | | 10/2002 | Lund et al. | 324/678 |
| 2007/0188969 A1 | * | 8/2007 | Lasalandra et al. | 361/160 |
| 2008/0196945 A1 | | 8/2008 | Konstas | 178/18.03 |
| 2008/0246723 A1 | | 10/2008 | Baumbach | 345/156 |
| 2009/0077402 A1 | * | 3/2009 | Huang et al. | 713/320 |
| 2009/0224776 A1 | * | 9/2009 | Keith | 324/686 |
| 2010/0026656 A1 | * | 2/2010 | Hotelling et al. | 345/174 |

OTHER PUBLICATIONS

International PCT Search Report, PCT/US2009/061624, 17 pages, Mailed Feb. 23, 2010.
Microchip Technology Inc., Brochure AN1104—"Capacitive Multibutton Configurations", Authors, Keith Curtis and Tom Perme, 2007 (10 pages).

* cited by examiner

*Primary Examiner* — Huy Q Phan
*Assistant Examiner* — Temilade S Rhodes-Vivour
(74) *Attorney, Agent, or Firm* — King & Spalding L.L.P.

(57) ABSTRACT

A scan module of an electronic device scans a capacitive keypad for detection of the actuation of any capacitive touch sensor. This scan module remains in operation even when major power consuming circuits of the electronic device are in a sleep mode, and will not wake up the major power consuming circuits until an action requiring the circuits is needed, thereby, reducing overall power consumption of the electronic device while still maintaining scanning of the capacitive keypad. Upon detection of a valid key press of a capacitive touch sensor, an interrupt to the electronic device brings it out of a sleep mode and into an operating mode for further processing and appropriate action commensurate with the actuation of the specific capacitive touch sensor.

23 Claims, 3 Drawing Sheets

AUTOMATED CAPACITIVE TOUCH SCAN

RELATED PATENT APPLICATIONS

This application claims priority to commonly owned U.S. Provisional Patent Application Ser. No. 61/108,660; filed Oct. 27, 2008; entitled "Automated Capacitive Touch Scan," by James E. Bartling, Jason Tollefson and Bruce Bohn; United States Patent Application Pub. No. 2008/0204046, Ser. No. 11/115,672; filed May 6, 2008; entitled "Capacitive Measurement Apparatus and Method," by James E. Bartling, that claims priority to U.S. Pat. No. 7,460,441, issued Dec. 2, 2008; and U.S. patent application Ser. No. 12/165,950, filed Jul. 1, 2008, entitled "Current-Time Digital-to-Analog Converter" by Bartling et al.; all of which are hereby incorporated by reference herein for all purposes.

TECHNICAL FIELD

The present disclosure relates to capacitive touch sensors and keypads and, more particularly, to automated scan and control of capacitive keypads during both run, idle and sleep modes of an integrated circuit device.

BACKGROUND

Capacitive touch sensors are used as a user interface to electronic equipment, e.g., calculators, telephones, cash registers, gasoline pumps, etc. The capacitive touch sensors may be arranged in a keypad matrix and activated (controls a signal indicating activation) by a change in capacitance of the capacitive touch sensor when an object, e.g., user finger tip, causes the capacitance of the capacitive touch sensor to change. Generally, the keypad matrix of capacitive touch sensors are fabricated on a substrate with a protective covering, e.g., glass or clear plastic resin cover, over the capacitive touch sensors. The protective covering may also have alphanumeric characters thereon to identify the purpose of each the associated capacitive touch sensors.

When an object having capacitance, such as a user finger tip, comes in close proximity to the sensor element, the capacitance value of the sensor element changes. This capacitance change is electronically detected so as to generate a signal indicating activation of that capacitive touch sensor by the object in close proximity thereto. This electronic detection must be performed by an electronic device which requires power to operate the electronic device. Current technology requires that the electronic device, when in a sleep mode, be awakened in order to scan the keypad matrix of capacitive touch sensors. When the electronic device is in the low power standby or sleep mode, either response time to detection of the capacitance change or power consumption of the electronic device must suffer.

SUMMARY

What is needed is a way to provide automated scan and control of capacitive keypads irrespective of whether major power consuming logic circuits of an electronic device are in a run, idle or sleep mode. Being able to scan and control the capacitive touch sensors of the keypad matrix, will allow the power consuming logic circuits of an electronic device to remain in the low power sleep mode until required to be awakened for processing data and/or controlling a function. By not having to take into consideration the various power modes of the electronic device, user software (firmware) application code is simplified.

According to the teachings of this disclosure, a scan module capable of scanning the capacitive keypad for detection of any one or more of the capacitive touch sensors being activated may be performed while the major power consuming logic circuits of the electronic device remain in a low power sleep or standby mode. This scan module remains in operation even when the major power consuming logic circuits of the electronic device are in a sleep mode, and will not wake up the major power consuming logic circuits of the electronic device until an action requiring the logic circuits is needed, thereby, reducing overall power consumption.

According to the teachings of this disclosure, logic circuits, e.g., a state machine, may be used to sequence through the capacitive touch sensors of the keypad matrix, perform an analog-to-digital conversion of analog signal values from each of the capacitive touch sensors, perform digital comparisons of each of the digitized analog signal values, store compare values in a set of registers, and operate a digital comparator. Then upon detection of a valid key press of a capacitive touch sensor, the state machine would provide an interrupt to the electronic device to bring it out of a sleep mode and into an operating mode for further processing and appropriate action commensurate with the actuation of a specific capacitive touch sensor.

According to a specific example embodiment of this disclosure, an apparatus for measuring changes in the capacitances of a plurality of capacitive touch sensors comprises: a multiplexer having an output and a plurality of inputs adapted for coupling to a plurality of capacitive touch sensors, wherein each of the plurality of inputs is coupled to a respective one of the plurality of capacitive touch sensors; an analog-to-digital converter (ADC) having an analog input coupled to the output of the multiplexer; a discharge switch coupled between the output of the multiplexer and a supply common; a constant current source having a current value; a charge switch coupled between the output of the multiplexer and the constant current source; a threshold register having a threshold value stored therein; a digital comparator having a first input coupled to the threshold register and a second input coupled to an output of the ADC, wherein the threshold value stored in the threshold register is compared with a digital voltage value from the output of the ADC; a sequence controller coupled to and controlling the multiplexer, the ADC, the discharge switch, the charge switch, and an output from the digital comparator, wherein the sequence controller selects one input at a time from the plurality of inputs of the multiplexer, closes the discharge switch so that the respective one of the plurality of capacitive touch sensors coupled to the selected one of the plurality of inputs has substantially all voltage charge removed therefrom, opens the discharge switch and closes the charge switch for a time period, wherein during the time period the respective one of the plurality of capacitive touch sensors is coupled to the constant current source, whereby the respective one of the plurality of capacitive touch sensors is charged to a voltage value determined by the time period and the current value of the constant current source, triggers the ADC to sample and convert the voltage value to a digital representation thereof at the end of the time period, generates a touch detected signal when the digital representation of the voltage value is less than the threshold value stored in the threshold register, and indicates which one of the plurality of capacitive touch sensors is associated with the measured voltage value, otherwise no touch detection signal is generated.

According to another specific example embodiment of this disclosure, an integrated circuit digital device having logic circuits capable of being placed into a low power sleep mode or an operating mode, the digital device also having capacitance measurement circuits that operate independently of whether the logic circuits are in the sleep mode or the operating mode, wherein the capacitance measurement circuits measure changes in capacitances of a plurality of capacitive touch sensors, said apparatus comprising: a digital processor having logic circuits capable of being in a low power sleep mode or an operating mode; a multiplexer having an output and a plurality of inputs adapted for coupling to a plurality of capacitive touch sensors, wherein each of the plurality of inputs is coupled to a respective one of the plurality of capacitive touch sensors; an analog-to-digital converter (ADC) having an analog input coupled to the output of the multiplexer; a discharge switch coupled between the output of the multiplexer and a supply common; a constant current source having a current value; a charge switch coupled between the output of the multiplexer and the constant current source; a threshold register having a threshold value stored therein; a digital comparator having a first input coupled to the threshold register and a second input coupled to an output of the ADC, wherein the threshold value stored in the threshold register is compared with a digital voltage value from the output of the ADC; a sequence controller coupled to and controlling the multiplexer, the ADC, the discharge switch, the charge switch, and an output from the digital comparator, wherein the sequence controller selects one input at a time from the plurality of inputs of the multiplexer, closes the discharge switch so that the respective one of the plurality of capacitive touch sensors coupled to the selected one of the plurality of inputs has substantially all voltage charge removed therefrom, opens the discharge switch and closes the charge switch for a time period, wherein during the time period the respective one of the plurality of capacitive touch sensors is coupled to the constant current source, whereby the respective one of the plurality of capacitive touch sensors is charged to a voltage value determined by the time period and the current value of the constant current source, triggers the ADC to sample and convert the voltage value to a digital representation thereof at the end of the time period, generates a touch detected interrupt when the digital representation of the voltage value is less than the threshold value stored in the threshold register, and indicates which one of the plurality of capacitive touch sensors is associated with the measured voltage value, otherwise no touch detection interrupt is generated, wherein the touch detected interrupt causes the logic circuits of the digital processor to go from the low power sleep mode to the operating mode.

BRIEF DESCRIPTION OF THE DRAWINGS

A more complete understanding of the present disclosure thereof may be acquired by referring to the following description taken in conjunction with the accompanying drawings wherein.

Figure 1:
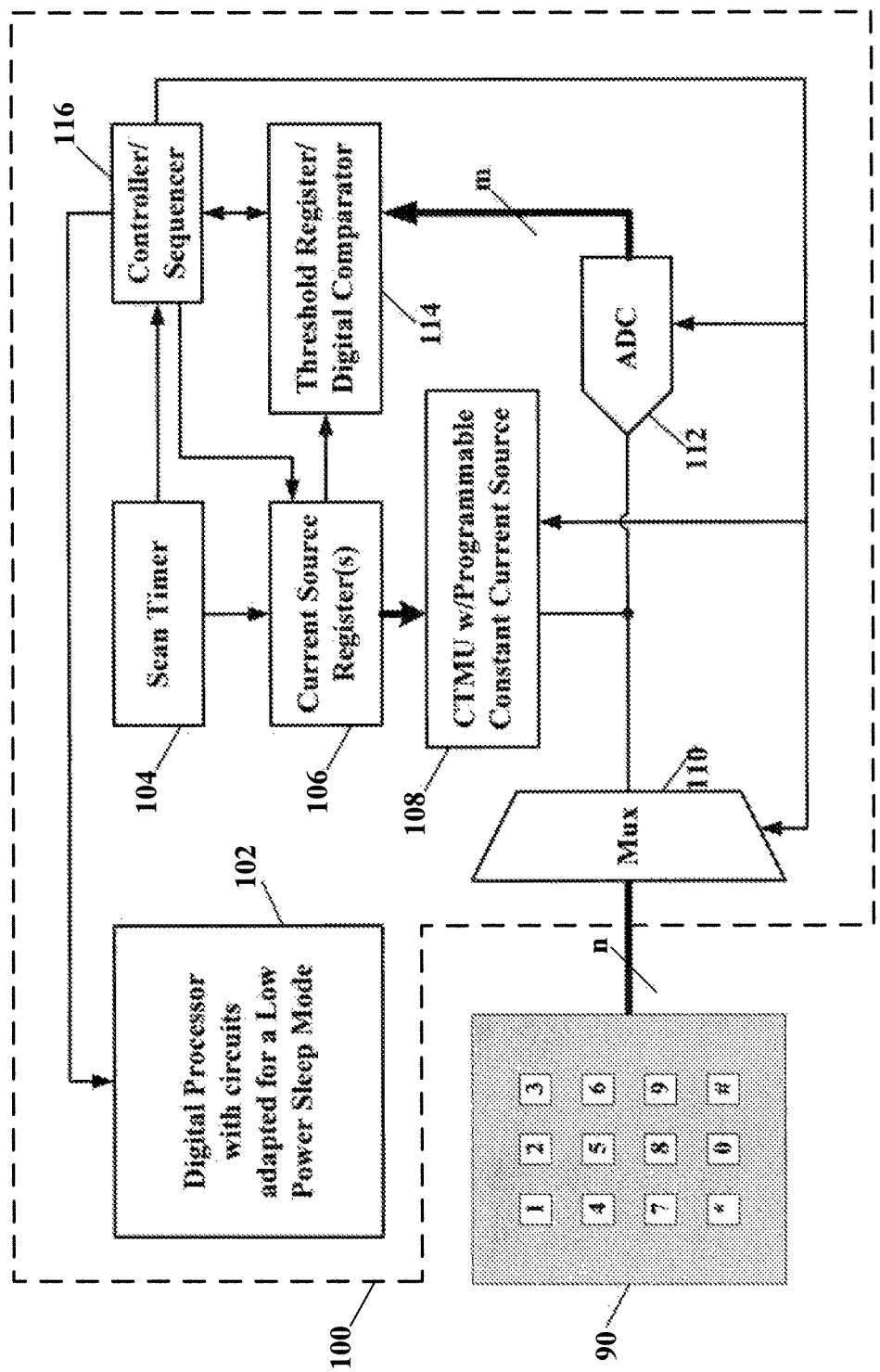
FIG. 1 is a schematic block diagram of an electronic device having independent automated capacitive touch scan coupled to a capacitive touch keypad, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of an example embodiment is schematically illustrated. Like elements in the drawings will be represented by like numbers, and similar elements will be represented by like numbers with a different lower case letter suffix.

Referring to FIG. 1, depicted is a schematic block diagram of an electronic device having independent automated capacitive touch scan coupled to a capacitive touch keypad, according to a specific example embodiment of this disclosure. A digital device 100 comprises a digital processor 102, a scan timer 104, a current source register 106, a charge time measurement unit (CTMU) 108 having a programmable constant current source, a multiplexer 110, an analog-to-digital converter 112, a threshold register and digital comparator 114, and a controller/sequencer 116. The digital device 100 is shown coupled to a capacitive touch keypad 90.

The digital processor 102 may be, for example but is not limited to, a microcontroller, microprocessor, digital signal processor (DSP), programmable logic array (PLA), application specific integrated circuit (ASIC), etc., and any combination thereof. The digital processor 102 has logic circuits (not shown) that are adapted to run in a normal mode (high power use) or a low power sleep mode. When in the low power sleep mode, very little or no power is used by the logic circuits, but the logic circuits also do not function. It is only when the logic circuits are brought back to the normal mode will they function. Wake-up/sleep mode circuits (not shown) are used with these logic circuits to control whether the logic circuits are in the normal (operating) or sleep mode.

The Scan Timer 102 sets the time between scans of the capacitive touch keypad 90. A current source register 106 is used to set the value of the constant current output from for the CTMU 108, and may differ for each capacitive key of the capacitive touch keypad 90. The threshold register/comparator 1 14 stores a value for comparison with the output of the ADC 112. The multiplexer 110 connects each capacitive key of the capacitive touch keypad 90 to an input of the ADC 112 and to the CTMU 108. The control/sequencer 116 may be a state machine that provides control and timing to the current source register 106, CTMU 108, ADC 112, and multiplexer 110. The capacitance value of each of the capacitive keys of the capacitive touch keypad 90 is determined, as more fully described hereinafter, and compared to respective target capacitance values stored in the threshold register/comparator 114. When a change the capacitance value of a capacitive key is detected, then the control/sequencer 116 will signal the wake-up/sleep mode circuits (not shown) to cause the logic circuits (not shown) of the digital processor 102 to return to the normal (operational) mode when in the low power sleep mode.

Figure 2:
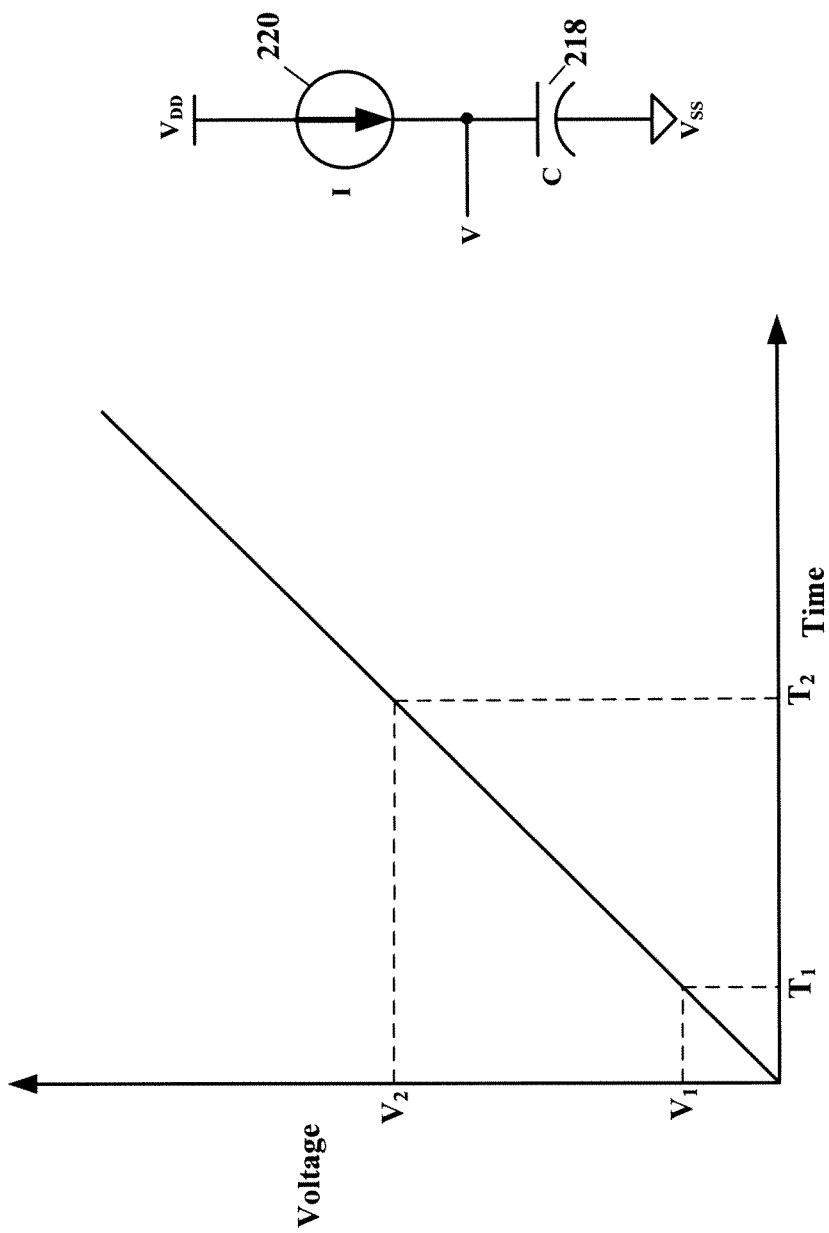
FIG. 2 is a time-voltage graph of a capacitor being charged from a constant current source.

Referring to FIG. 2, depicted is a time-voltage graph of a capacitor being charged from a constant current source. When a capacitor 218 is charged through a constant current source 220, the voltage, V, across the capacitor 218 increases linearly (monotonically) with time, according to equation (1):

$$I = C * dV/dT \qquad \text{Eq. (1)}$$

where C is the capacitance value of the capacitor 218, I is the current from the constant current source 220 and V is the voltage on the capacitor 218 at time T. When any three values of the current I; time T, capacitance C, and voltage V are known; the other unknown value may be calculated from the three known values. For example, if the capacitance of the capacitor 218, the charging current from the constant current source 220, and the time over which the capacitor 218 is charged by the constant current source 220 are known, then the voltage V may be determined. Thus by knowing the current value, I, from the constant current source 220, the capacitance value, C, of the capacitor 218, and the time, T, that the charging current from the current source 220 is applied to the capacitor 218, the capacitor 218 may be charged to a very precise voltage, V. By integrating equation (1) and solving for C, an exact capacitance value may be determined according to equation (2):

$$C = I/V * T \qquad \text{Eq.(2)}$$

Figure 3:
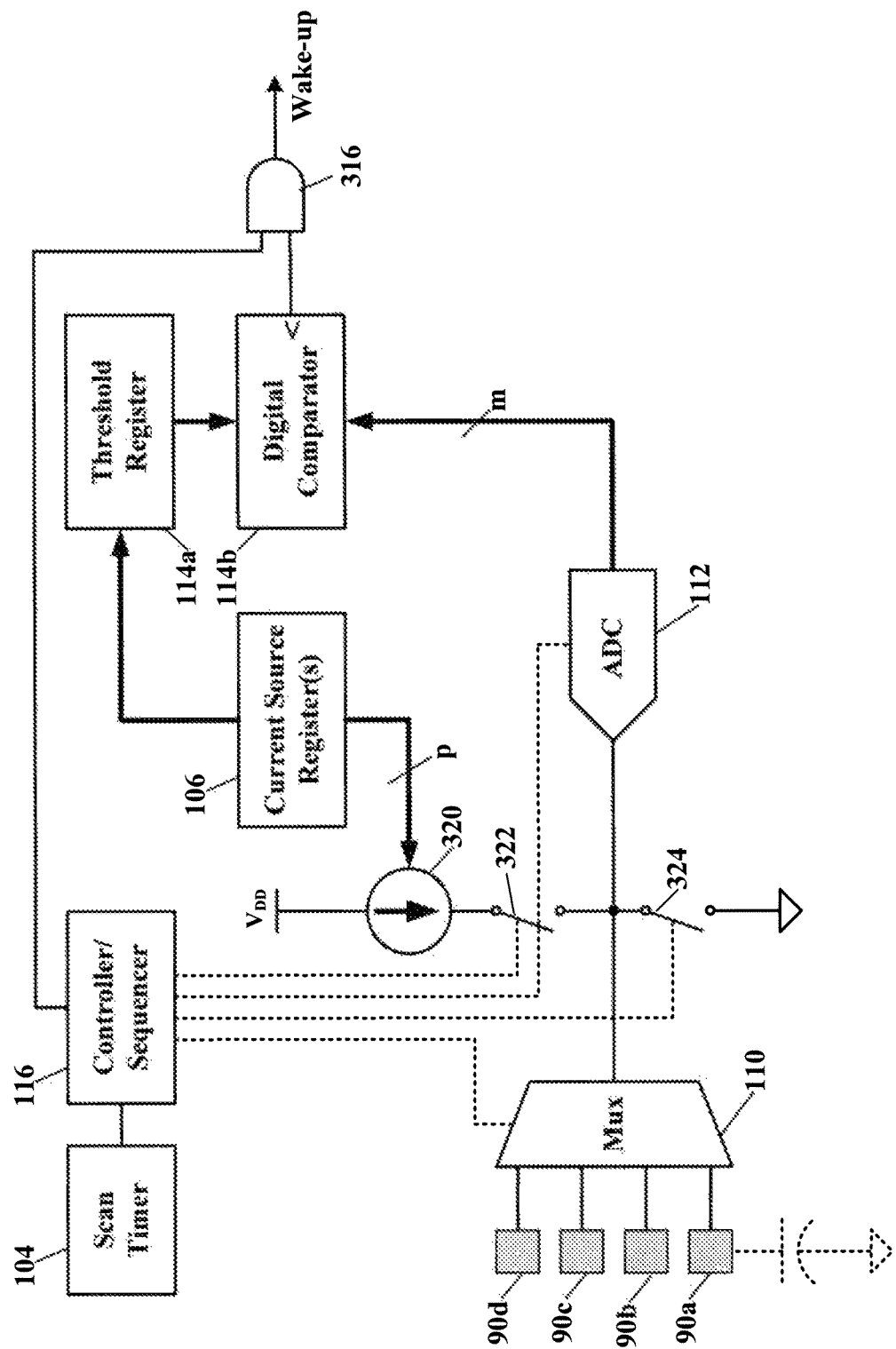
FIG. 3 is a more detailed block diagram of the independent automated capacitive touch scan as shown in FIG. 2, according to a specific example embodiment of this disclosure.

The capacitance value of each of the capacitive keys is determined by applying a constant current value, I, for a known time period, T, then measuring the resulting voltage, V, with the ADC 112 at the end of the time period, T. A more detailed explanation of how a precision capacitance value is measured by using the circuit shown in FIGS. 1 and 3 is more fully disclosed in commonly owned U.S. Pat. No. 7,460,441; United States Patent Application Pub. No. 2008/0204046 to James E. Bartling, Ser. No. 11/115,672; filed May 6, 2008; entitled "Capacitive Measurement Apparatus and Method," by James E. Bartling; and U.S. patent application Ser. No. 12/165,950, filed Jul. 1, 2008, entitled "Current-Time Digital-to-Analog Converter" by Bartling et al.; all of which are hereby incorporated by reference herein for all purposes.

Referring to FIG. 3, depicted is a more detailed block diagram of the independent automated capacitive touch scan as shown in FIG. 2, according to a specific example embodiment of this disclosure. The circuit shown in FIG. 2 runs independently of whether the logic circuits of the digital processor 102 are in a normal or sleep mode. As discussed above and more fully in the references cited herein, voltage values, V, are determined from known current values, I, after applying to the capacitive touch keys 90 for periods of time, T. The ADC 112 converts the analog voltage values to digital voltage values, then the digital comparator 114b compares the digital voltage values from the ADC 112 to expected digital values from the threshold register 114a. An expected digital value represents the capacitance value of a capacitive key that is not actuated (touched). When a capacitive key is actuated (touched) its capacitance value will increase and will thereby charge from the constant current source 106 over time, T, to a lower voltage, V. Now the digital voltage value from the ADC 112 will be lower than the expected voltage value stored in the threshold register 114a and the digital comparator 114b will indicate this condition so as to notify the wake-up/sleep mode circuits as more fully described hereinabove.

The scan timer 104 is used in determining time period intervals and as a timing clock for the controller/sequencer 116 that may be, for example but is not limited to, a state machine. The controller/sequencer 116 controls selection of which input of the multiplexer 110 is coupled to the output, when the discharge switch 324 is closed and opened, and for how long the charge switch 322 is closed. The current source register(s) 106 store a digital value(s) for setting the constant current from the programmable constant current source 320. The controller/sequencer 116 triggers when the ADC 112 takes a sample of the analog voltage for conversion to become a digital voltage value.

A calibrate operation may be performed for the capacitive touch keys when they are not actuated so as to obtain base values of voltages that each of the capacitors of the capacitive touch keys charge to when coupled to the constant current source 320 over the time period, T. This calibration operation produces expected baseline voltage values of the capacitive keys when they are not actuated, and thereafter actuation of a capacitive key will produce a lower voltage value that is detected with the digital comparator 114b to produce a wake-up signal from the output of gate 316.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for measuring changes in the capacitances of a plurality of capacitive touch sensors, said apparatus comprising:

a multiplexer having an output and a plurality of inputs adapted for coupling to a plurality of capacitive touch sensors, wherein each of the plurality of inputs is coupled to a respective one of the plurality of capacitive touch sensors;

an analog-to-digital converter (ADC) having an analog input coupled to the output of the multiplexer;

a discharge switch coupled between the output of the multiplexer and a supply common;

a constant current source having a current value and an output;

a charge switch coupled between the output of the multiplexer and the output of the constant current source;

a threshold register having a threshold value stored therein;

a digital comparator having a first input coupled to the threshold register and a second input coupled to an output of the ADC, wherein the threshold value stored in the threshold register is compared with a digital voltage value from the output of the ADC;

a sequence controller coupled to and controlling the multiplexer, the ADC, the discharge switch, the charge switch, and an output from the digital comparator, wherein the sequence controller selects one input at a time from the plurality of inputs of the multiplexer, closes the discharge switch so that the respective one of the plurality of capacitive touch sensors coupled to the selected one of the plurality of inputs has substantially all voltage charge removed therefrom, opens the discharge switch and closes the charge switch for a time period, wherein during the time period the respective one of the plurality of capacitive touch sensors is coupled to the constant current source, whereby the respective one of the plurality of capacitive touch sensors is charged to a voltage value determined by the time period and the current value of the constant current source, triggers the ADC to sample and convert the voltage value to a digital representation thereof at the end of the time period, generates a touch detected signal when the digital representation of the voltage value is less than the threshold value stored in the threshold register, and indicates which one of the plurality of capacitive touch sensors is associated with the measured voltage value, otherwise no touch detection signal is generated.

2. The apparatus according to claim 1, wherein the current value is any one of a plurality of current values determined by a programmable constant current source.

3. The apparatus according to claim 1, wherein the plurality of capacitive touch sensors are arranged in a keypad matrix.

4. The apparatus according to claim 1, wherein the digital comparator first input comprises a plurality of first parallel inputs and the second input comprises a plurality of second parallel inputs.

5. The apparatus according to claim 1, wherein the digital comparator first input comprises a single bit first serial input and the second input comprises a single bit second serial input.

6. The apparatus according to claim 1, wherein the sequence controller is a state logic machine.

7. The apparatus according to claim 1, wherein the touch detected signal is used to wake-up logic circuits in a low power sleep mode.

8. The apparatus according to claim 1, wherein the touch detected signal provides an interrupt to an electronic device for requesting that circuits of the electronic device be brought out of a sleep mode and into an operating mode.

9. The apparatus according to claim 1, wherein the sequence controller timing is controlled by a scan timer.

10. The apparatus according to claim 9, wherein the scan timer is a precision clock.

11. The apparatus according to claim 1, wherein the threshold register comprises a plurality of threshold registers and a plurality of threshold values stored therein.

12. The apparatus according to claim 11, wherein the plurality of threshold values are determined by measuring the voltage values associated with each one of the plurality of capacitive touch sensors when not touched.

13. An integrated circuit digital device having logic circuits capable of being placed into a low power sleep mode or an operating mode, the digital device also having capacitance measurement circuits that operate independently of whether the logic circuits are in the sleep mode or the operating mode, wherein the capacitance measurement circuits measure changes in capacitances of a plurality of capacitive touch sensors, said apparatus comprising:

a digital processor having logic circuits capable of being in a low power sleep mode or an operating mode;

a multiplexer having an output and a plurality of inputs adapted for coupling to a plurality of capacitive touch sensors, wherein each of the plurality of inputs is coupled to a respective one of the plurality of capacitive touch sensors;

an analog-to-digital converter (ADC) having an analog input coupled to the output of the multiplexer;

a discharge switch coupled between the output of the multiplexer and a supply common;

a constant current source having a current value and an output;

a charge switch coupled between the output of the multiplexer and the output of the constant current source;

a threshold register having a threshold value stored therein;

a digital comparator having a first input coupled to the threshold register and a second input coupled to an output of the ADC, wherein the threshold value stored in the threshold register is compared with a digital voltage value from the output of the ADC;

a sequence controller coupled to and controlling the multiplexer, the ADC, the discharge switch, the charge switch, and an output from the digital comparator, wherein the sequence controller selects one input at a time from the plurality of inputs of the multiplexer, closes the discharge switch so that the respective one of the plurality of capacitive touch sensors coupled to the selected one of the plurality of inputs has substantially all voltage charge removed therefrom, opens the discharge switch and closes the charge switch for a time period, wherein during the time period the respective one of the plurality of capacitive touch sensors is coupled to the constant current source, whereby the respective one of the plurality of capacitive touch sensors is charged to a voltage value determined by the time period and the current value of the constant current source, triggers the ADC to sample and convert the voltage value to a digital representation thereof at the end of the time period, generates a touch detected interrupt when the digital representation of the voltage value is less than the threshold value stored in the threshold register, and indicates which one of the plurality of capacitive touch sensors is associated with the measured voltage value, otherwise no touch detection interrupt is generated, wherein the touch detected interrupt causes the logic circuits of the digital processor to go from the low power sleep mode to the operating mode.

14. The apparatus according to claim 13, wherein the current value is any one of a plurality of current values determined by a programmable constant current source.

15. The apparatus according to claim 13, wherein the plurality of capacitive touch sensors are arranged in a keypad matrix.

16. The apparatus according to claim 13, wherein the digital comparator first input comprises a plurality of first parallel inputs and the second input comprises a plurality of second parallel inputs.

17. The apparatus according to claim 13, wherein the digital comparator first input comprises a single bit first serial input and the second input comprises a single bit second serial input.

18. The apparatus according to claim 13, wherein the sequence controller is a state logic machine.

19. The apparatus according to claim 13, wherein the sequence controller timing is controlled by a scan timer.

20. The apparatus according to claim 19, wherein the scan timer is a precision clock.

21. The apparatus according to claim 13, wherein the threshold register comprises a plurality of threshold registers and a plurality of threshold values stored therein.

22. The apparatus according to claim 21, wherein the plurality of threshold values are determined by measuring the voltage values associated with each one of the plurality of capacitive touch sensors when not touched.

23. The apparatus according to claim 13, wherein the digital processor is a microcontroller.

* * * * *